United States Patent
Chi et al.

(10) Patent No.: US 9,748,157 B1
(45) Date of Patent: Aug. 29, 2017

(54) INTEGRATED CIRCUIT PACKAGING SYSTEM WITH JOINT ASSEMBLY AND METHOD OF MANUFACTURE THEREOF

(71) Applicant: STATS ChipPAC Pte. Ltd., Singapore (SG)

(72) Inventors: HeeJo Chi, Yeoju-gun (KR); HanGil Shin, Seoul (KR); NamJu Cho, Uiwang-si (KR); Kyung Moon Kim, Seongnam (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 711 days.

(21) Appl. No.: 13/904,401

(22) Filed: May 29, 2013

(51) Int. Cl.
*H01L 23/00* (2006.01)
*H01L 23/28* (2006.01)
*H01L 21/56* (2006.01)

(52) U.S. Cl.
CPC .............. *H01L 23/28* (2013.01); *H01L 21/56* (2013.01)

(58) Field of Classification Search
CPC .................................................... H01L 21/563
See application file for complete search history.

(56) References Cited

U.S. PATENT DOCUMENTS

| | | | |
|---|---|---|---|
| 7,989,707 B2 | 8/2011 | Yamano et al. | |
| 8,264,091 B2 | 9/2012 | Cho et al. | |
| 2001/0000929 A1* | 5/2001 | Gilleo | H01L 21/563 257/795 |
| 2001/0050181 A1* | 12/2001 | Miura | H05K 3/3436 174/256 |
| 2004/0075164 A1* | 4/2004 | Pu | H01L 23/5385 257/686 |
| 2005/0161829 A1* | 7/2005 | Zeng | B23K 35/26 257/772 |
| 2009/0008765 A1* | 1/2009 | Yamano et al. | 257/690 |
| 2011/0031610 A1* | 2/2011 | Yamazaki | H01L 23/4985 257/693 |
| 2011/0074024 A1* | 3/2011 | Pendse | H01L 21/563 257/737 |
| 2011/0256662 A1 | 10/2011 | Yamano et al. | |
| 2012/0002386 A1* | 1/2012 | Pykari et al. | 361/760 |
| 2012/0225522 A1 | 9/2012 | Zhao et al. | |

* cited by examiner

*Primary Examiner* — William Harriston
(74) *Attorney, Agent, or Firm* — Wong & Rees LLP (57) ABSTRACT

An integrated circuit packaging system and method of manufacture thereof includes: a base substrate having a bottom pad; an integrated circuit device mounted on the base substrate; an interposer having a package interconnect mounted on the base substrate, the package interconnect includes an underside base portion having an irregular surface characteristic of a coining process; and an encapsulation between the interposer and the base substrate.

20 Claims, 7 Drawing Sheets

INTEGRATED CIRCUIT PACKAGING SYSTEM WITH JOINT ASSEMBLY AND METHOD OF MANUFACTURE THEREOF

TECHNICAL FIELD

The present invention relates generally to an integrated circuit packaging system, and more particularly to a system having a joint assembly.

BACKGROUND ART

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The packaging configurations that house and protect IC require them to be made smaller, thinner, and sturdier as well.

Thus, a need still remains for an integrated circuit packaging system with a joint assembly and method of manufacture thereof providing low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate having a bottom pad; mounting an integrated circuit device on the base substrate; providing an interposer having a package interconnect mounted thereon; clamping the interposer to the base substrate, the package interconnect coined onto the bottom pad; and forming an encapsulation between the interposer and the base substrate.

The present invention provides an integrated circuit packaging system including: a base substrate having a bottom pad; an integrated circuit device mounted on the base substrate; an interposer having a package interconnect mounted on the base substrate, the package interconnect includes an underside base portion having an irregular surface characteristic of a coining process; and an encapsulation between the interposer and the base substrate.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The depictions in the FIGs. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct physical contact between elements. The term "directly on" means there is direct physical contact between elements with no intervening elements. The term "processing" as used herein includes deposition of material, patterning, exposure, development, etching, cleaning, molding, and/or removal of the material or as required in forming a described structure.

Figure 1:
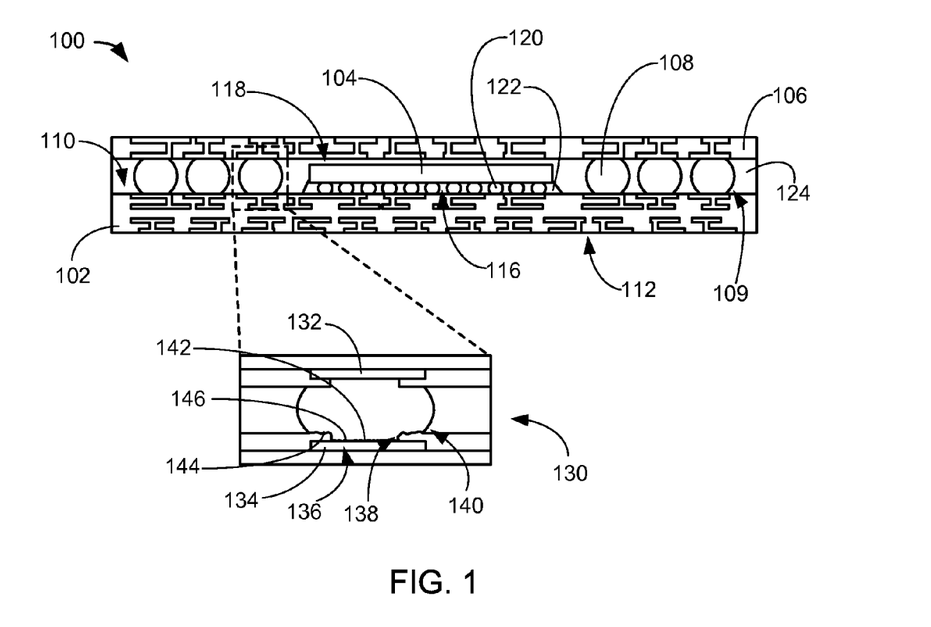
FIG. 1 is a cross-sectional view of an integrated circuit packaging system along a line 1-1 of FIG. 2 in a first embodiment of the present invention.
Figure 2:
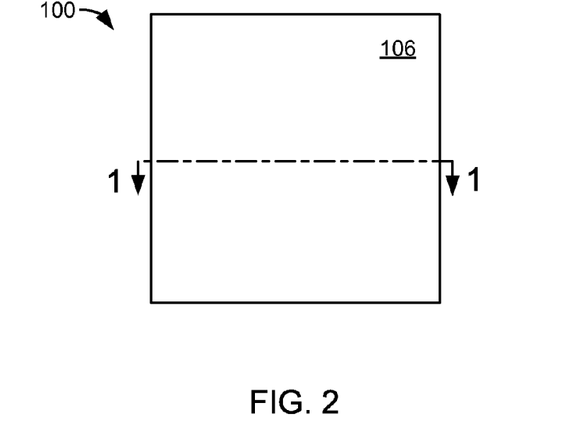
FIG. 2 is a top view of the integrated circuit packaging system.

Referring now to FIG. 1, therein is shown a cross-sectional view of an integrated circuit packaging system 100 along a line 1-1 of FIG. 2 in a first embodiment of the present invention. The integrated circuit packaging system 100 includes a base substrate 102, an integrated circuit device 104, an interposer 106, and a package interconnect 108.

The base substrate 102 can provide support and connectivity for components and devices. For example, the base substrate 102 can include a printed circuit board (PCB), a leadframe, a carrier substrate, a semiconductor substrate with electrical interconnections, a ceramic substrate, or a multi-layer structure (e.g., a laminate with one or more conductive layers separated by an insulator) suitable for electrically interconnecting integrated circuit systems formed on or above the base substrate 102 to external electrical circuits. For illustrative purposes, the base substrate 102 is shown as a multi-layer structure.

The base substrate 102 can include conductive layers and conductive traces embedded therein. The base substrate 102 can include a component side 110 for mounting components, devices, and packages. The base substrate 102 can also include a system side 112, which is a side opposite to the component side 110, for connecting to a next system level (not shown).

The integrated circuit device 104 is defined as a semiconductor device having one or more integrated transistors for implementing active circuitry. For example, the integrated circuit device 104 can include interconnects, passive devices, or a combination thereof. For example, a flip-chip or a wafer scale chip can be representative of the integrated circuit device 104. The integrated circuit device 104 is preferably shown in a flip-chip configuration. However, the integrated circuit device 104 can also be in a wire-bonded configuration.

The integrated circuit device 104 can be attached or mounted to the component side 110 of the base substrate 102 by a device interconnect 120. The device interconnect 120 provides an electrical connection and can include a solder ball, a bond wire, solder, or a solder pillar as examples. The device interconnect 120 provides electrical connectivity between the integrated circuit device 104 and the base substrate 102 and the device interconnect 120 can be reflowed for attaching to the base substrate 102.

The integrated circuit device 104 can include an interconnect side 116 for attaching the device interconnect 120. The interconnect side 116 can include chip contacts, fabricated thereon, and directly attached to the device interconnect 120. The integrated circuit device 104 can also include a device top side 118 which is a side opposite the interconnect side 116.

The integrated circuit packaging system 100 can have an under-fill 122, such as a capillary or a mold type between the integrated circuit device 104 and the base substrate 102. The under-fill 122 provides protection from the environment to the integrated circuit device 104 and the device interconnect 120. The under-fill 122 can be optional for the integrated circuit packaging system 100.

The interposer 106 can be a support structure similar to the base substrate 102. For example, the interposer 106 can include a printed circuit board (PCB), a leadframe, a carrier substrate, a semiconductor substrate with electrical interconnections, a ceramic substrate, or a multi-layer structure (e.g., a laminate with one or more conductive layers separated by an insulator) suitable for electrically interconnecting integrated circuit systems formed on or above the interposer 106. For illustrative purposes, the interposer 106 is shown as a multi-layer structure.

The package interconnect 108 provides an electrical connection between the base substrate 102 and the interposer 106 and can include a solder ball, a metal post, and a stud bump with or without a solder cap as examples. The package interconnect 108 can include lead (Pb) free solder such as tin, silver, copper, or a combination thereof (SnAgCu) with a melting point around 220 degrees Celsius.

The package interconnect 108 can be pre-assembled onto the interposer 106 before being mounted to the base substrate 102. For example, the package interconnect 108 can be chemically attached to the interposer 106 using a solder ball mount (SBM) reflow method.

The integrated circuit packaging system 100 can have an encapsulation 124 between the interposer 106 and the base substrate 102 and covering the integrated circuit device 104, the device interconnect 120, and the under-fill 122. The encapsulation 124 can also surround the package interconnect 108. The encapsulation 124 provides a hermetic seal for the integrated circuit device 104 and the package interconnect 108 for providing protection from the environment.

The encapsulation 124 can have a flow molding temperature lower than the melting point temperature of the package interconnect 108. For example, the encapsulation 124 can have a molding temperature including the range of 165 degrees to 185 degrees Celsius.

A joint assembly 130 is a portion or region of the integrated circuit packaging system 100 including the attachment points between the interposer 106, the package interconnect 108, and the base substrate 102. For illustrative purposes, a detailed view of the joint assembly 130 is provided.

The joint assembly 130 can include a top pad 132 of the interposer 106. The top pad 132 is a bond pad for attaching the package interconnect 108 to the interposer 106. The joint assembly 130 can also include a bottom pad 134 of the base substrate 102 for attaching the package interconnect 108 to the base substrate 102.

The bottom pad 134 can include a pad top surface 136, which is a side of the top pad 132 facing opposite to the system side 112 of the base substrate 102. The bottom pad 134 can also include a pad lip 138, which is defined as a periphery portion of the bottom pad 134 extending from the pad top surface 136 to the component side 110 of the base substrate 102. The pad lip 138 can include sidewalls of the bottom pad 134 extending from the pad top surface 136 to the component side 110 of the base substrate 102.

The package interconnect 108 can include an underside 140, which is defined as the bottom half of the package interconnect 108. For example, the underside 140 can include the bottom hemisphere of the package interconnect 108. The underside 140 is a portion of the package interconnect 108 facing opposite to the interposer 106. For example, the underside 140 of the package interconnect 108 can include the surface of the lower hemisphere of a solder ball. The underside 140 can include an underside base portion 142 and an underside periphery portion 144.

The underside 140 of the package interconnect 108 can be mechanically attached to the base substrate 102 through clamping, pressing, or a compression method. The mechanical mounting process will be explained in greater detail below. Optionally, the package interconnect 108 can subsequently be reflowed to form a full solder joint of the package interconnect 108 with the base substrate 102 at the underside 140.

The underside base portion 142 is defined as the bottom cap of the package interconnect 108. For example, the underside base portion 142 can be located at the southern or bottom pole of the package interconnect 108 on a side of the package interconnect 108 opposite to the top pad 132. The underside base portion 142 is the portion of the package interconnect 108 directly attached to the pad top surface 136 of the bottom pad 134.

The underside periphery portion 144 is defined as the portion of the underside 140 extending from the underside base portion 142 to an equator line of the package interconnect 108. For example, the underside periphery portion 144 includes the portions of the underside 140 surrounding the underside base portion 142.

The package interconnect 108 can include an irregular surface 146, which is defined as a non-smooth surface having indentations, stress fractures, and micro-fractures. The irregular surface 146 is at the underside base portion 142 of the package interconnect 108 and results from the coining or mechanical pressing method used to attach the underside 140 to the bottom pad 134.

The irregular surface 146 has characteristics of the coining process, which include a non-smooth surface with indentions, stress fractures, and micro-fractures of surface of the underside 140. The irregular surface 146 can partially cover the pad top surface 136 because of the lack of a SBM process.

The coining of the package interconnect 108 is defined as a process of compressing or squeezing the package interconnect 108 to a desired or planned height. The clamping pressure of a top mold chase can be used to coin the package interconnect 108 to the desired height according to the design requirements of the integrated circuit packaging system 100. The molding process for applying the encapsulation 124 can occur simultaneously or in parallel with the coining process. The pressure used on the package interconnect 108 in the coining process can be the same pressure used for the clamping pressure used during the attachment of the interposer 106. During clamping, the molding process can encapsulate the integrated circuit device 104, the device interconnect 120, and the under-fill 122.

It has been discovered that the configuration of the integrated circuit packaging system 100 provides for the package interconnect 108 and the interposer 106 to be coined or compressed to a desired height. The coining process for the interposer 106 allows for precise control in determining the vertical height of the package interconnect 108 and the overall vertical height of the integrated circuit packaging system 100.

It has been discovered that the configuration of the integrated circuit packaging system 100 with pre-assembly for the interposer 106 provides for fabrication of multiple units of the integrated circuit packaging system 100 in a strip-level basis instead of fabrication by an individual unit-level basis. For example, the base substrate 102 can be formed from substrate strips having a number of the integrated circuit device 104 mounted thereon. The interposer 106 with the package interconnect can also be pre-assembled from strips and attached to the base substrate 102 in a strip-level basis for increasing efficiency in manufacturing.

It has been discovered that the integrated circuit packaging system 100 with pre-assembly of the interposer 106 to the package interconnect and coining combines manufacturing steps for increasing manufacturing efficiency and reducing manufacturing costs. Further, it has been discovered that the configuration of the interposer 106 eliminates the need for laser ablation and via cleaning for providing an electrical connection between the base substrate 102 and the interposer 106.

Referring now to FIG. 2, therein is shown a top view of the integrated circuit packaging system 100. A top surface of the interposer 106 is shown.

Figure 3:
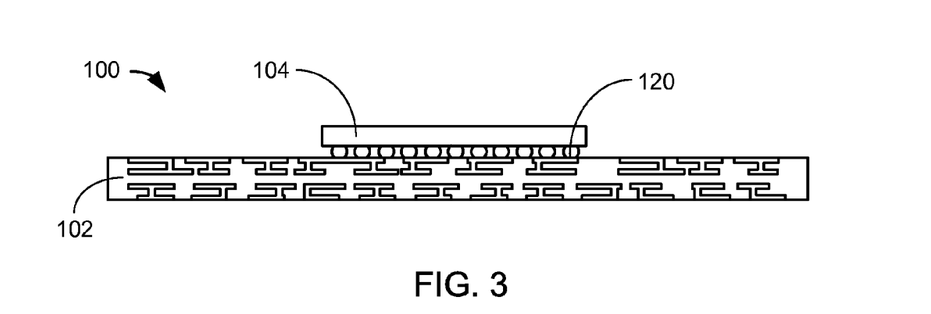
FIG. 3 is the integrated circuit packaging system in a die-attach phase of manufacture.

Referring now to FIG. 3, therein is shown the integrated circuit packaging system 100 in a die-attach phase of manufacture. The base substrate 102 is provided. For illustrative purposes, the base substrate 102 is shown as a single singulated unit, although it is understood that the base substrate 102 can be part of a larger strip that is later singulated in a package singulation stage.

The integrated circuit device 104 is attached to the base substrate 102 by the device interconnect 120. A solder ball mount (SBM) process can be used to chemically attach the integrated circuit device 104, the device interconnect 120, and the base substrate 102. The SBM process can include a reflow method for melting the device interconnect 120 between the integrated circuit device 104 and the base substrate 102.

The under-fill 122 of FIG. 1 (not shown) can be formed between the integrated circuit device 104 and the base substrate 102 although it is understood that the under-fill 122 can be optional.

Figure 4:
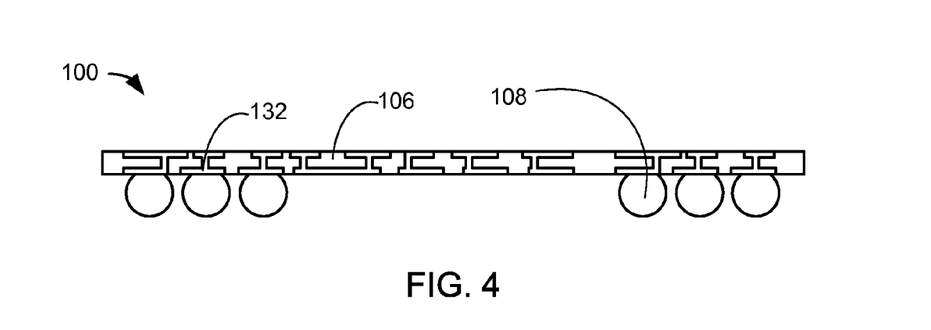
FIG. 4 is therein is shown the integrated circuit packaging system in an interposer preassembly phase of manufacture.

Referring now to FIG. 4, therein is shown the integrated circuit packaging system 100 in an interposer preassembly phase of manufacture. The interposer 106 is provided. The package interconnect 108 is attached to the top pad 132 of the interposer 106. A SBM reflow process can be used to chemically attach the package interconnect 108 to the top pad 132 of the interposer 106.

Figure 5:
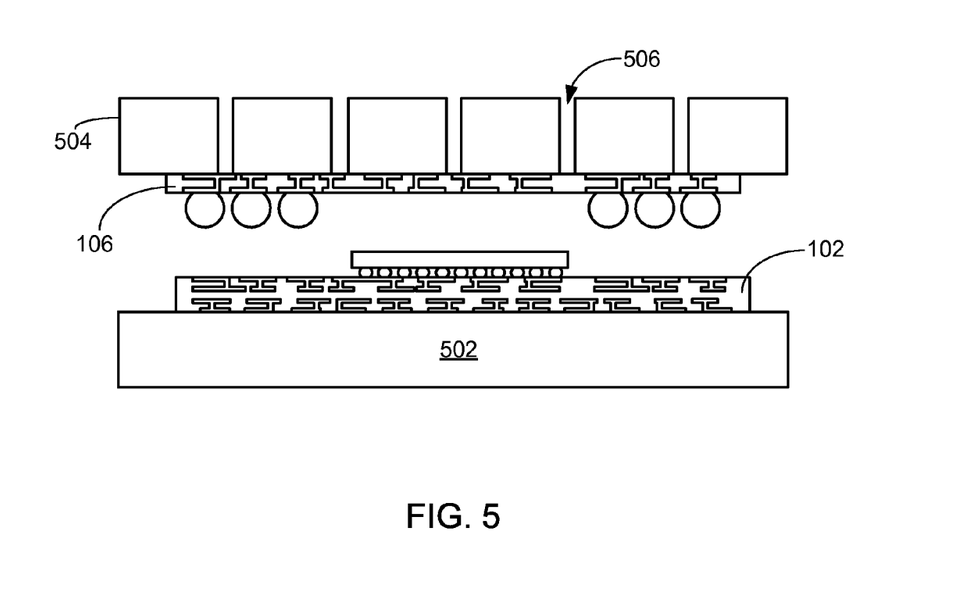
FIG. 5 is the structures of FIGS. 3 and 4 in a chase-loading phase of manufacture.

Referring now to FIG. 5, therein is shown the structures of FIGS. 3 and 4 in a chase-loading phase of manufacture. The base substrate 102 can be placed on a bottom mold chase 502. The interposer 106 can be loaded to a top mold chase 504. The top mold chase 504 can include a vacuum hole 506 for loading the interposer 106.

A dual Pattern Recognition System (PRS) can be used for individual alignment of the base substrate 102 and the interposer 106 prior to clamping. The PRS (vision system) can be used in strip-level or unit-level interposer attachment. The PRS can be used in the case of small size and fine pitch attachment of the interposer 106. The PRS provides accurate alignment of the base substrate 102 and the interposer 106.

Figure 6:
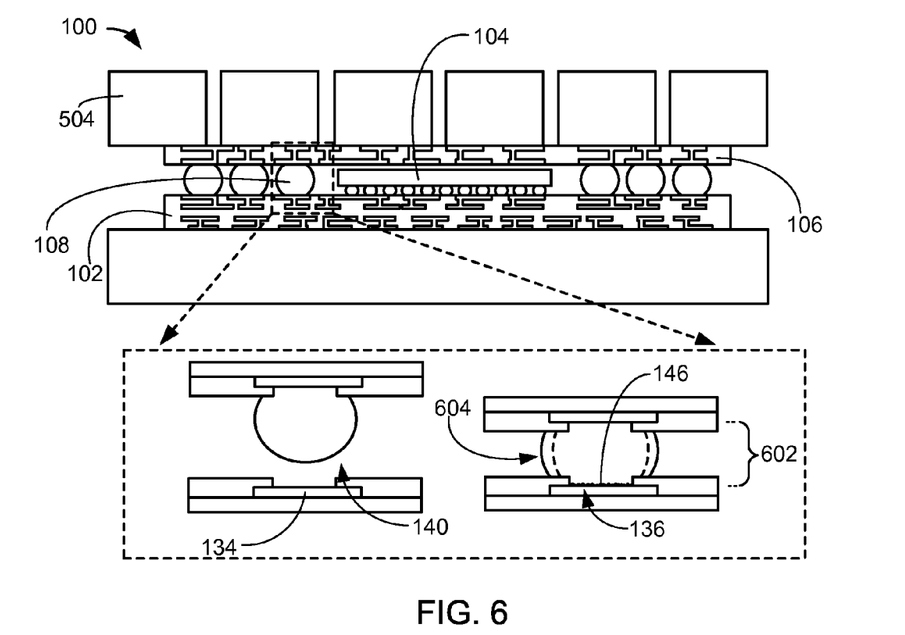
FIG. 6 is the structure of FIG. 5 in a chase-clamping phase of manufacture.

Referring now to FIG. 6, therein is shown the structure of FIG. 5 in a chase-clamping phase of manufacture. The top mold chase 504 is used to mechanically clamp the package interconnect 108 of the interposer 106 onto the bottom pad 134 of the base substrate 102.

The package interconnect 108 can be coined to a pre-specified height 602. The pre-specified height 602 is defined as a height of the package interconnect 108, measured vertically from the top surface of the base substrate 102. The pre-specified height 602 is determined by the specifications of the integrated circuit packaging system 100. For example, the pre-specified height 602 can be determined by the vertical height of the integrated circuit device 104 to allow a pre-determined amount of clearance between the interposer 106 and the device top side 118 of FIG. 1 of the integrated circuit device 104.

The coining of the package interconnect 108 is defined as a process of compressing or squeezing the package interconnect 108 to the desired height or the pre-specified height 602. The clamping pressure of the top mold chase 504 can be used to coin the package interconnect 108 to the pre-specified height 602 according to the design requirements of the integrated circuit packaging system 100.

The pre-specified height 602 can result in a low profile for the package interconnect 108, where the coining process can substantially compress the package interconnect 108 but avoid a point where solder bridge between adjacent interconnects occurs. For example, the pre-specified height 602 can equal the height of the device top side 118 from the base substrate 102. A protrusion 604 of a lateral portion of the package interconnect 108 can occur from the coining process. The protrusion 604 can overhang the bottom pad 134 with the width of the protrusion 604 determined by the amount of pressure used during coining.

The pre-specified height 602 can include different height ratios associated with height and width dimensions for the package interconnect 108. For example, a base or end of line profile for the package interconnect 108 can include a width of 339.5 µm and a height of 250 µm. The package interconnect 108 with a height ratio 92 percent from the base profile can include a circumference width of 334 µm, a top surface width of 165 µm, and a height of 229 µm at 99 gram-force (gf)/ball.

Further for example, the package interconnect 108 with a height ratio 83 percent from the base profile can include a circumference width of 337 µm, a top surface width of 216 µm, and a height of 207 µm at 172 gf/ball. The package interconnect 108 with a height ratio 73 percent from the base profile can include a circumference width of 358 µm, a top surface width of 245 µm, and a height of 183 µm at 230 gf/ball. The package interconnect 108 with a height ratio 51 percent from the base profile can include a circumference width of 423 µm, a top surface width of 369 µm, and a height of 128 µm at 456 gf/ball.

Further for example, the package interconnect 108 with a height ratio 42 percent from the base profile can include a circumference width of 440 µm, a top surface width of 421 µm, and a height of 105 µm at 677 gf/ball. The package interconnect 108 with a height ratio 36 percent from the base profile can include a circumference width of 475 µm, a top surface width of 477 µm, and a height of 91 µm at 907 gf/ball.

The coining or mechanical compression of the package interconnect 108 can cause the irregular surface 146 on the underside 140 of the package interconnect 108. The underside 140 of the package interconnect 108 is compressed against the bottom pad 134. The irregular surface 146 has characteristics of the coining process, which include a non-smooth surface with indentions, stress fractures, and micro-fractures on the surface of the underside 140. The irregular surface 146 can partially cover the pad top surface 136 because of the lack of a SBM process.

It has been discovered that the package interconnect 108 having a pre-specified height 602 between a range of 250 µm to 91 µm provides for a customizable low profile height from the coining of the package interconnect 108. The pre-specified height 602 allows the overall height of the integrated circuit packaging system 100 to be manufactured to a desired or planned specification including matching the height of the device top side 118 from the base substrate 102.

It has been discovered that the protrusion 604 of the package interconnect 108 allows for excess amounts of material from the package interconnect 108 to laterally shift over the bottom pad 134 during the coining process. The protrusion 604 allows for coining of the package interconnect 108 to the pre-specified height 602 but is limited to the point of possible solder bridge, where the protrusion 604 will contact another of the package interconnect 108.

Figure 7:
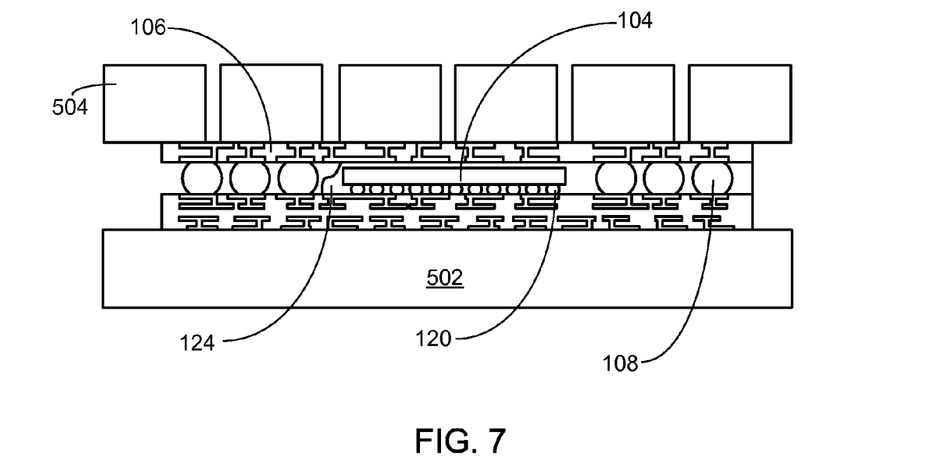
FIG. 7 is the structure of FIG. 6 in an encapsulation-transfer phase of manufacture.

Referring now to FIG. 7, therein is shown the structure of FIG. 6 in an encapsulation-transfer phase of manufacture. The encapsulation 124 can cover the integrated circuit device 104 and the device interconnect 120, if the under-fill 122 of FIG. 1 is not applied. The encapsulation 124 can surround the exposed surfaces of the package interconnect 108.

The encapsulation 124 can be injected between the bottom mold chase 502 and the top mold chase 504 for covering the integrated circuit device 104. For example, a transfer molding process can be used to form the encapsulation 124. For illustrative purposes, FIG. 7 shows the encapsulation filling in the space between the interposer 106 and the base substrate 102. During the transfer molding process, small amounts of the encapsulation 124 may flow under the package interconnect 108.

The encapsulation 124 can have a mold temperature lower than the melting temperature of the package interconnect 108. The transfer molding process does not disrupt the package interconnect 108 because the melting temperature of the package interconnect 108 is higher than the mold temperature of the encapsulation 124. The encapsulation 124 can surround the exposed areas of the package interconnect 108.

The mold temperature of the encapsulation 124 can include a range of 165 degrees to 185 degrees Celsius. For example, the encapsulation 124 can include a mold resin that is solidified during mold curing.

It has been discovered that the coining process combined with the encapsulation 124 provide for adhesion and structural integrity of the integrated circuit packaging system 100 without the need for a SBM reflow process. The encapsulation 124 can adhere the interposer 106 and the package interconnect 108 to the base substrate 102 after coining, removing the need for an additional reflow process of manufacture and thus reducing overall process steps. Further, it has been discovered that the combination of the coining process and the encapsulation 124 preserves or locks in the pre-specified height 602 of FIG. 6, if subsequent SBM reflow is needed.

Figure 8:
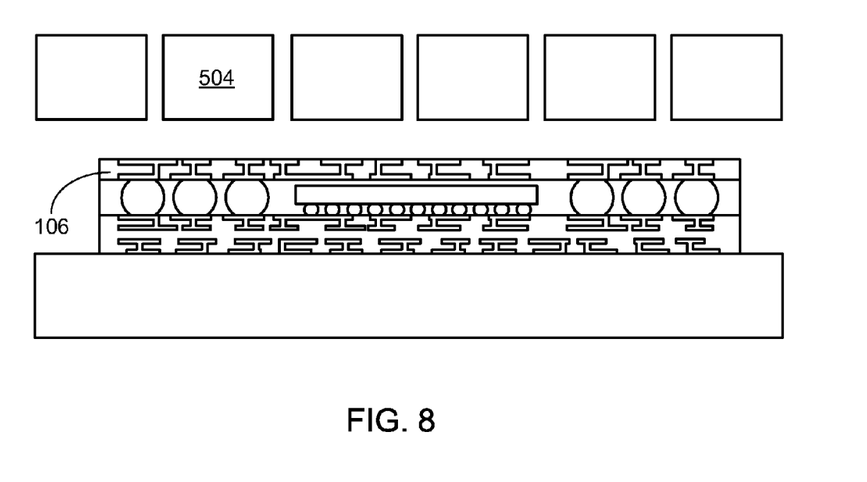
FIG. 8 is the structure of FIG. 7 in a chase-unclamping phase of manufacture.

Referring now to FIG. 8, therein is shown the structure of FIG. 7 in a chase-unclamping phase of manufacture. The top mold chase 504 is removed from the interposer 106 after the completion of the encapsulation-transfer phase.

Figure 9:
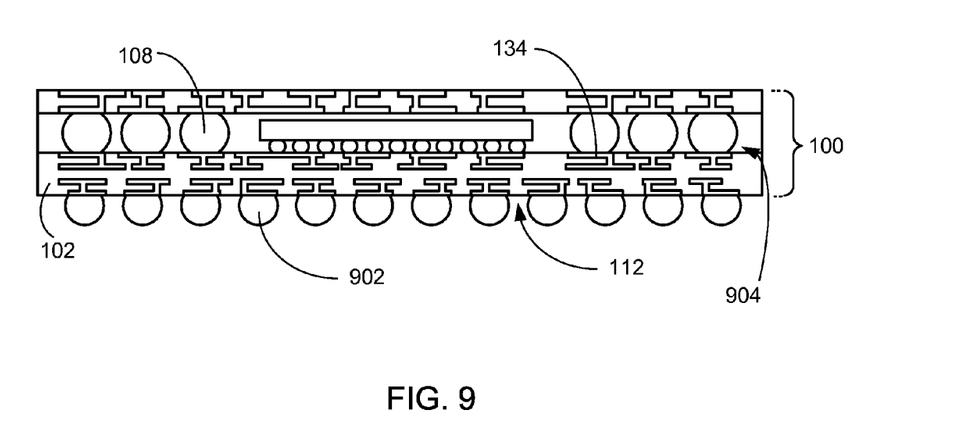
FIG. 9 is the structure of FIG. 8 in an interconnect-attach phase of manufacture.

Referring now to FIG. 9, therein is shown the structure of FIG. 8 in an interconnect-attach phase of manufacture. The integrated circuit packaging system 100 can be removed from the bottom mold chase 502 of FIG. 5.

An external interconnect 902 can be attached to the system side 112 of the base substrate 102. The external interconnect 902 is defined as a conductive structure for electrically coupling the integrated circuit packaging system 100 to other structures, such as components or other packages. For example, the external interconnect 902 can be a solder ball, a conductive post, a land, or a combination thereof.

A SBM reflow process can be used to chemically join the external interconnect 902 to the base substrate 102. The SBM reflow process can also simultaneous create a chemical joint between the package interconnect 108 and the bottom pad 134. During SBM reflow, the irregular surface 146 of FIG. 1 can be removed by the melting of the package interconnect 108. After the conclusion of the reflow process, the underside 140 of FIG. 1 of the package interconnect 108 can form a smooth hermetic seal or an intermetallic compound 904 (IMC) between the package interconnect 108 and the bottom pad 134.

The encapsulation 124 of FIG. 7 has been previous cured and the solidified state of the encapsulation 124 preserves the height of the package interconnect 108 during reflow of the package interconnect 108 and the external interconnect 902.

It has been discovered that the method of attaching the interposer 106 and the package interconnect 108 to the base substrate 102 allows for forming a simultaneous chemical joint for both the package interconnect 108 and the external interconnect 902. A chemical joint can be formed for the package interconnect 108 and the external interconnect 902 at the same time during the same stage of manufacture and thus removes the need for two separate process steps. The simultaneous method removes fabrication steps improving manufacturing efficiency and lowering construction costs.

Further, it has been discovered that the combination of the coining process and the encapsulation 124 preserves or locks in the pre-specified height 602 of FIG. 6, if subsequent SBM reflow is needed during attachment of the external interconnect 902.

Figure 10:
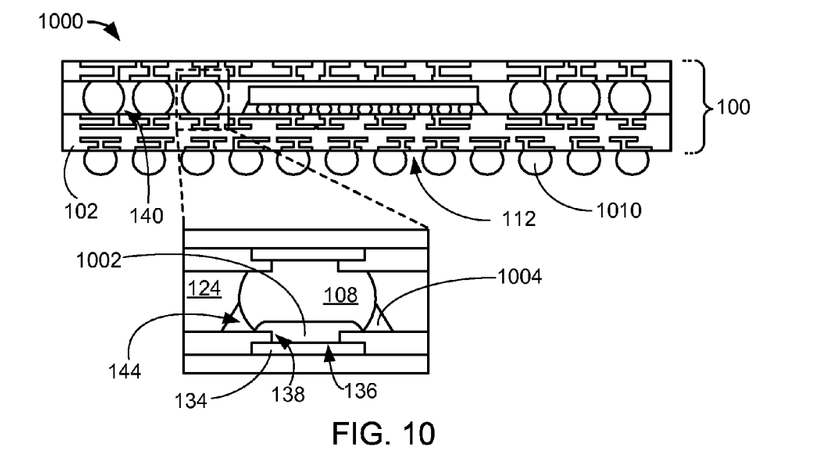
FIG. 10 is a cross-sectional view of an integrated circuit packaging system along a line 1-1 of FIG. 2 in a second embodiment of the present invention.

Referring now to FIG. 10, therein is shown a cross-sectional view of an integrated circuit packaging system 1000 along a line 1-1 of FIG. 2 in a second embodiment of the present invention. The integrated circuit packaging system 1000 can be similar to the integrated circuit packaging system 100 of FIG. 1 except the integrated circuit packaging system 1000 can include a pad solder paste 1002 and an epoxy flux 1004.

It is understood that the integrated circuit packaging system 1000 and the integrated circuit packaging system 100 can share identical element numbers, except the integrated circuit packaging system 1000 includes the pad solder paste 1002 and the epoxy flux 1004 in direct contact with the package interconnect 108.

The pad solder paste 1002 can be printed on the bottom pad 134 of the base substrate 102. The pad solder paste 1002 can have a melting temperature that is lower than the melting temperature of the encapsulation 124. The pad solder paste 1002 can soak in the package interconnect 108 during clamping and for creating a barrier that prevents mold flashing of the pad top surface 136 and the underside 140 of the package interconnect 108. The pad solder paste 1002 can also cover the pad lip 138 of the bottom pad 134.

The pad solder paste 1002 can have a melting point of 138 degrees Celsius, which enables a peak reflow temperature of between 170-180 degrees Celsius. The pad solder paste 1002 can have a lower melting point than the package interconnect 108 for reflowing the pad solder paste 1002 without the need to reflow the package interconnect 108. The pad solder paste 1002 can include tin, bismuth, silver, or a combination thereof (SnBiAg).

The epoxy flux 1004 is on the underside 140 of the package interconnect 108. The epoxy flux 1004 can be applied to the underside 140 of the package interconnect 108 before mounting and coining. After coining, the epoxy flux 1004 can cover the underside periphery portion 144 of the package interconnect 108.

The epoxy flux 1004 can include a viscosity of about 13,000 cps (plus or minus ten percent), a thixotropic index of 3.7 (plus or minus ten percent), and a Tg of 75.4 degrees Celsius. The epoxy flux 1004 can have a molding temperature and curing behavior similar to the encapsulation 124.

The epoxy flux 1004 functions as a barrier for preventing the encapsulation 124 from contacting the pad solder paste 1002 and the bottom pad 134. The epoxy flux 1004 can be cured at the molding temperature for forming a barrier prior to mold transferring of the encapsulation 124. The integrated circuit packaging system 1000 can include external interconnects 1010 mounted to the system side 112 of the base substrate 102.

It has been discovered that the pad solder paste 1002 and the epoxy flux 1004 prevents mold resin intrusion or mold flash of the bottom pad 134 and the underside 140 of the package interconnect 108. The pad solder paste 1002 and the epoxy flux 1004 function like a dam or barrier preventing any flash to the underside 140 of the package interconnect 108. Preventing mold resin intrusion increases the reliability of the electrical connection between the package interconnect 108 and the base substrate 102.

It has been discovered that the configuration of the integrated circuit packaging system 100 provides for the package interconnect 108 and the interposer 106 of FIG. 1 to be coined or compressed to a desired height. The coining process for the interposer 106 allow for precise control in determining the vertical height of the package interconnect 108 and the overall vertical height of the integrated circuit packaging system 100.

It has been discovered that the configuration of the integrated circuit packaging system 100 with pre-assembly for the interposer 106 provides for fabrication of multiple units of the integrated circuit packaging system 100 by a strip-level basis instead of fabrication by an individual unit basis. For example, the base substrate 102 can be formed from substrate strips having a number of the integrated circuit device 104 of FIG. 1 mounted thereon. The interposer 106 with the package interconnect can also be pre-assembled from strips and attached to the base substrate 102 in a strip-level basis.

It has been discovered that the integrated circuit packaging system 100 with pre-assembly of the interposer 106 and coining combines manufacturing steps for increasing manufacturing efficiency and reducing manufacturing costs. Further it has been discovered that the configuration of the interposer 106 eliminates the need for laser ablation and via cleaning for providing an electrical connection between the base substrate 102 and the interposer 106.

Further, it has been discovered that the combination of the coining process and the encapsulation 124 preserves or locks in the pre-specified height 602 of FIG. 6, if subsequent SBM reflow is needed.

Figure 11:
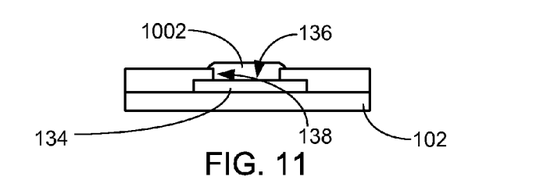
FIG. 11 is a detailed view of the base substrate of the integrated circuit packaging system of FIG. 10 in a paste-printing phase of manufacture.

Referring now to FIG. 11, therein is shown a detailed view of the base substrate 102 of the integrated circuit packaging system 1000 of FIG. 10 in a paste-printing phase of manufacture. The pad solder paste 1002 can be printed on the bottom pad 134 of the base substrate 102. The pad solder paste 1002 can completely cover the pad top surface 136 and cover the pad lip 138.

The pad solder paste 1002 can be printed on the bottom pad 134 before the interposer 106 of FIG. 1 is clamped to the base substrate 102. For example, the pad solder paste 1002 can be printed on the bottom pad 134 after the integrated circuit device 104 of FIG. 1 is attached to the base substrate 102.

Figure 12:
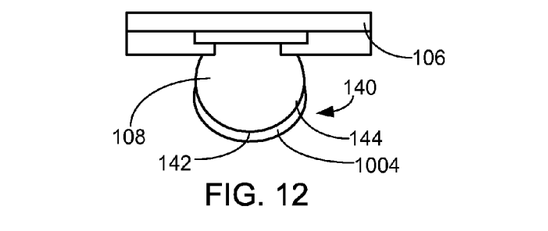
FIG. 12 a detailed view of the interposer of the integrated circuit packaging system of FIG. 10 in a flux-application phase of manufacture.

Referring now to FIG. 12, therein is shown a detailed view of the interposer 106 of the integrated circuit packaging system 1000 of FIG. 10 in a flux-application phase of manufacture. The epoxy flux 1004 is applied to the package interconnect 108.

For example, the epoxy flux 1004 can be applied by dipping the package interconnect 108 into the epoxy flux 1004. The epoxy flux 1004 can cover the underside 140 of the package interconnect 108 including covering the underside base portion 142 and the underside periphery portion 144.

Figure 13:
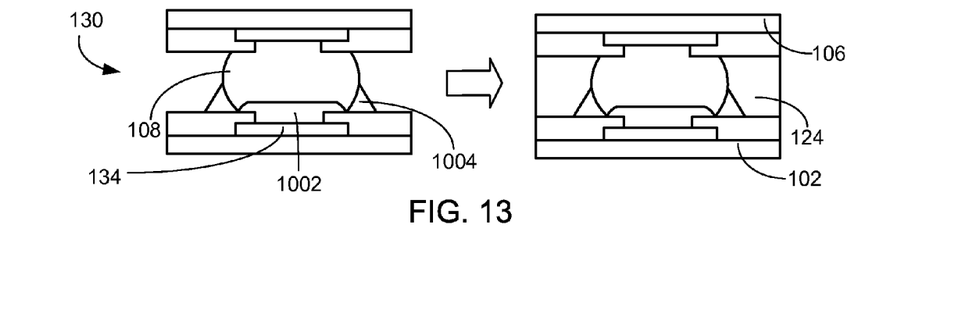
FIG. 13 a detailed view of the joint assembly of the integrated circuit packaging system of FIG. 10 in a mounting and molding phase of manufacture.

Referring now to FIG. 13, therein is shown a detailed view of the joint assembly 130 of the integrated circuit packaging system 1000 of FIG. 10 in a mounting and molding phase of manufacture. The interposer 106 with the package interconnect 108 can be clamped and coined onto the bottom pad 134 of the base substrate 102. The pad solder paste 1002 can cover the underside base portion 142 of FIG. 12 of the package interconnect 108.

The epoxy flux 1004 can cover the underside periphery portion 144 of FIG. 10 of the package interconnect 108. The clamping and coining process can force the epoxy flux 1004 away from the underside base portion 142 and the epoxy flux 1004 can settle to cover the underside periphery portion 144 of the package interconnect 108.

The epoxy flux 1004 on the underside periphery portion 144 of the package interconnect 108 can prevent the encapsulation 124 from coming in contact with the bottom pad 134 and the underside base portion 142. The encapsulation 124 can be applied to the integrated circuit packaging system 1000.

During the mold transfer process, the pad solder paste 1002 can form a chemical joint with the underside 140 of the package interconnect 108. The melting temperature of the pad solder paste 1002 can be lower than the molding temperature of the encapsulation 124 and the melting temperature of the package interconnect 108. The chemical joint between the pad solder paste 1002 and the package interconnect 108 can occur as the integrated circuit packaging system 1000 is heated for the mold transferring.

The epoxy flux 1004 acts as a barrier layer to prevent the encapsulation 124 from touching the pad solder paste 1002, the underside base portion 142, and the bottom pad 134. The epoxy flux 1004 can be cured prior to transfer molding of the encapsulation 124.

Figure 14:
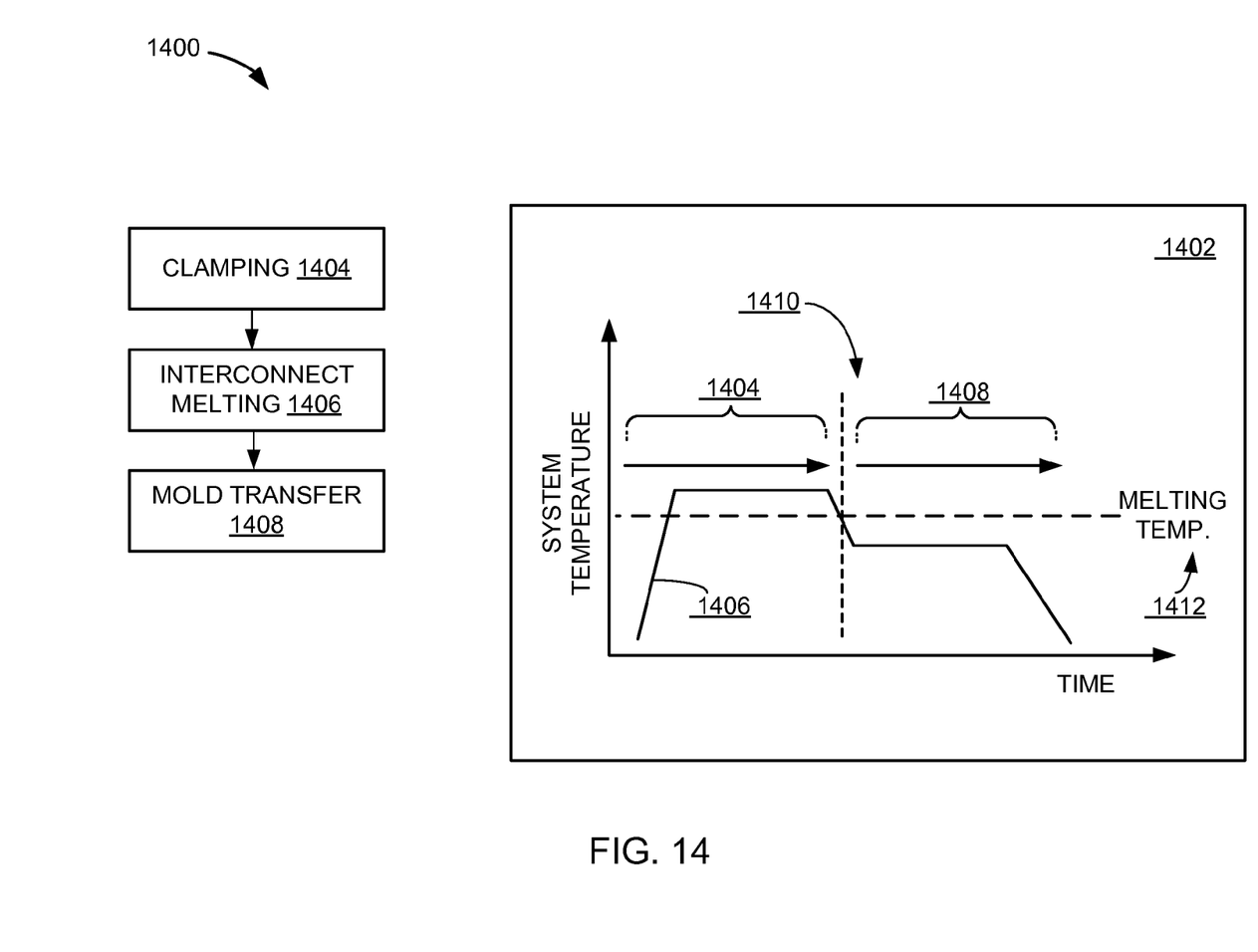
FIG. 14 an exemplary flow chart of an interposer-attach phase of manufacture in a third embodiment of the present invention.

Referring now to FIG. 14, therein is shown an exemplary flow chart 1400 of an interposer-attach phase of manufacture in a third embodiment of the present invention. The exemplary flow chart can also include a temperature chart 1402.

The interposer 106 of FIG. 1 with the package interconnect 108 of FIG. 1 can be coined to the bottom pad 134 of FIG. 1 of the base substrate 102 of FIG. 1 in a clamping phase 1404. The integrated circuit packaging system 100 of FIG. 1 can be heated to above a melting temperature 1412 of the package interconnect 108 in an interconnect melting phase 1406.

The system temperature of the components in the mold chase can be heated to above the melting temperature 1412 of the package interconnect 108. A SBM process can occur between the package interconnect 108 and the bottom pad 134 for forming an intermetallic compound and the system temperature can be allowed to cool. Before the system temperature cools below a mold temperature 1410, encapsulation of the package can begin. The mold temperature 1410 is defined as a temperature needed to reflow and transfer the mold. The integrated circuit packaging system 100 can begin cooling before mold transfer.

The encapsulation 124 of FIG. 1 can be applied to the integrated circuit packaging system 100 after the interconnect melting phase 1406. When the integrated circuit packaging system 100 reaches a temperature below the melting temperature 1412 of the package interconnect 108, a mold transfer process of the encapsulation 124 can begin in a transfer phase 1408. Reflow of the package interconnect 108 and transfer molding of the encapsulation 124 can occur during the same heat cycle.

It has been discovered that the process of mold clamping and heating the integrated circuit packaging system 100 results in reflow of the package interconnect 108 and transfer molding of the encapsulation 124 in a single heat cycle. The process removes separate and discrete manufacturing steps, improving manufacturing step efficiently and reducing energy and manufacturing costs.

Figure 15:
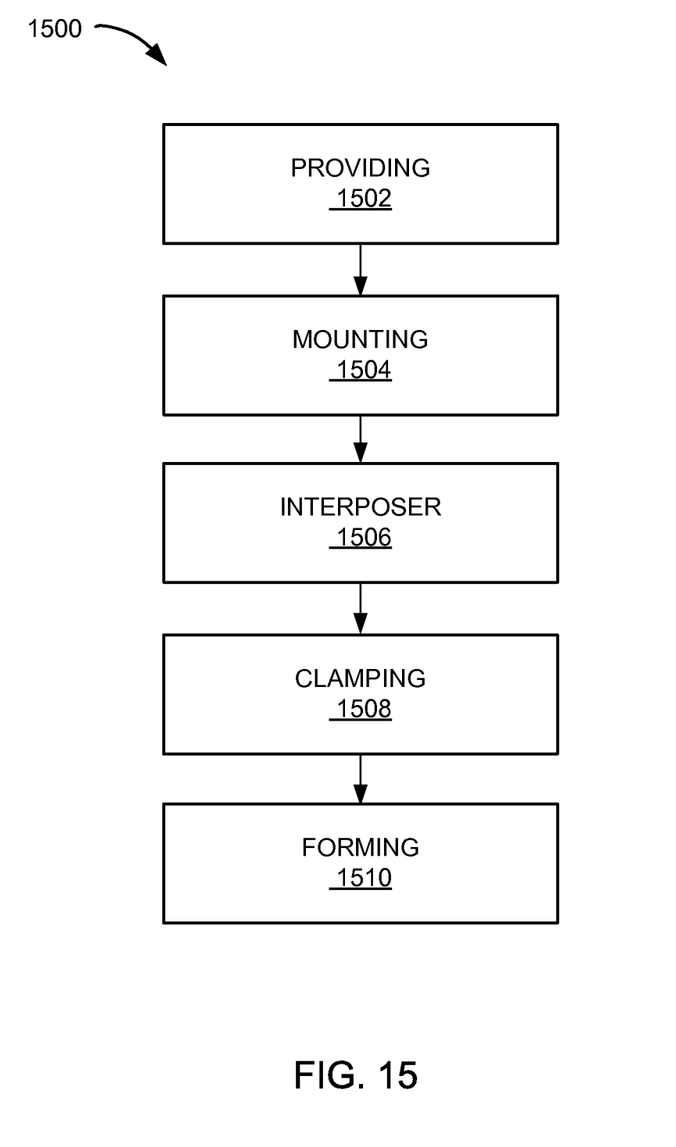
FIG. 15 is a flow chart of a method of manufacture of the integrated circuit packaging system of FIG. 1 in a further embodiment of the present invention.

Referring now to FIG. 15, therein is shown a flow chart of a method 1500 of manufacture of the integrated circuit packaging system 100 of FIG. 1 in a further embodiment of the present invention. The method 1500 includes: providing a base substrate having a bottom pad in a block 1502; mounting an integrated circuit device on the base substrate in a block 1504; providing an interposer having a package interconnect mounted thereon in a block 1506; clamping the interposer to the base substrate, the package interconnect coined onto the bottom pad in a block 1508; and forming an encapsulation between the interposer and the base substrate in a block 1510.

Yet other important aspects of the embodiments include that it valuably supports and services the historical trend of reducing costs, simplifying systems, and increasing performance. These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a base substrate having a bottom pad;

mounting an integrated circuit device on the base substrate;

providing an interposer having a package interconnect mounted thereon;

clamping the interposer to the base substrate, the package interconnect coined onto the bottom pad, the package interconnect coined to a fixed height allowing a set amount of clearance between the interposer and a device top side of the integrated circuit device, the interposer over the integrated circuit device with the package interconnect outside a perimeter of the integrated circuit device, and the package interconnect includes an irregular surface characteristic of a mechanical pressing method; and forming an encapsulation between the interposer and the base substrate.

2. The method as claimed in claim 1 further comprising printing a pad solder paste on the bottom pad.

3. The method as claimed in claim 1 wherein forming the interposer includes forming an epoxy flux on the package interconnect.

4. The method as claimed in claim 1 wherein clamping the interposer includes coining the package interconnect to the fixed height of between 91 μm to 250 μm.

5. The method as claimed in claim 1 further comprising:
attaching an external interconnect to the base substrate; and
reflowing the package interconnect simultaneously during the attachment of the external interconnect.

6. A method of manufacture of an integrated circuit packaging system comprising:
providing a base substrate having a bottom pad;
mounting an integrated circuit device on the base substrate;
providing an interposer having a package interconnect, the interposer mounted directly on the package interconnect;
clamping the interposer to the base substrate, the package interconnect coined to the bottom pad at a fixed height allowing a set amount of clearance between the interposer and a device top side of the integrated circuit device, the interposer over the integrated circuit device with the package interconnect outside a perimeter of the integrated circuit device, and the package interconnect includes an irregular surface characteristic of a mechanical pressing method; and
forming an encapsulation between the interposer and the base substrate.

7. The method as claimed in claim 6 further comprising printing a pad solder paste on a pad top surface of the bottom pad for preventing mold flash on the bottom pad.

8. The method as claimed in claim 6 further comprising applying an epoxy flux to an underside of the package interconnect, the epoxy flux on an underside periphery portion of the package interconnect for preventing mold flash to the bottom pad.

9. The method as claimed in claim 6 further comprising applying an under-fill between the integrated circuit device and the base substrate.

10. The method as claimed in claim 6 further comprising reflowing the package interconnect for forming an intermetallic compound between the package interconnect and the base substrate.

11. An integrated circuit packaging system comprising:
a base substrate having a bottom pad;
an integrated circuit device mounted on the base substrate;
an interposer having a package interconnect mounted on the base substrate, the package interconnect at a fixed height allowing a set amount of clearance between the interposer and a device top side of the integrated circuit device, the interposer over the integrated circuit device with the package interconnect outside a perimeter of the integrated circuit device, and the package interconnect includes an underside base portion having an irregular surface characteristic of a mechanical pressing method; and
an encapsulation between the interposer and the base substrate.

12. The system as claimed in claim 11 further comprising a pad solder paste on the bottom pad.

13. The system as claimed in claim 11 further comprising an epoxy flux on the package interconnect.

14. The system as claimed in claim 11 wherein the package interconnect is coined to the fixed height of between 91 μm to 250 μm.

15. The system as claimed in claim 11 further comprising an external interconnect attached to the base substrate.

16. The system as claimed in claim 11 wherein the interposer is mounted directly over the package interconnect.

17. The system as claimed in claim 16 further comprising a pad solder paste directly on a pad top surface of the bottom pad.

18. The system as claimed in claim 16 wherein the epoxy flux is on an underside periphery portion of the package interconnect for preventing mold flash on the bottom pad.

19. The system as claimed in claim 16 further comprising an under-fill between the integrated circuit device and the base substrate.

20. The system as claimed in claim 16 wherein the encapsulation has a mold temperature lower than a melting temperature of the package interconnect.

* * * * *